US010574027B2

(12) United States Patent
Itabashi et al.

(10) Patent No.: US 10,574,027 B2
(45) Date of Patent: Feb. 25, 2020

(54) LASER DRIVER CIRCUIT AND OPTICAL TRANSMITTER USING THE SAME

(71) Applicant: SUMITOMO ELECTRIC INDUSTRIES, LTD., Osaka (JP)

(72) Inventors: Naoki Itabashi, Osaka (JP); Keiji Tanaka, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/265,241

(22) Filed: Feb. 1, 2019

(65) Prior Publication Data

US 2019/0245324 A1 Aug. 8, 2019

(30) Foreign Application Priority Data

Feb. 5, 2018 (JP) ................................ 2018-018037

(51) Int. Cl.
*H01S 5/042* (2006.01)
*H01S 3/091* (2006.01)
*H01S 5/062* (2006.01)

(52) U.S. Cl.
CPC ............ *H01S 5/042* (2013.01); *H01S 3/0912* (2013.01); *H01S 5/0427* (2013.01); *H01S 5/06213* (2013.01)

(58) Field of Classification Search
CPC .... H01S 5/042; H01S 5/0427; H01S 5/06213; H01S 3/0912
See application file for complete search history.

(56) References Cited

U.S. PATENT DOCUMENTS 6,798,797 B2 * 9/2004 Mangano .............. H01S 5/0428
372/29.01

FOREIGN PATENT DOCUMENTS

JP 2005-033019 2/2005
JP 2007-266493 10/2007

* cited by examiner

*Primary Examiner* — Armando Rodriguez
(74) *Attorney, Agent, or Firm* — Smith, Gambrell & Russell, LLP.

(57) ABSTRACT

An LD driver circuit includes an adjustment circuit to which a power supply voltage is applied. The adjustment circuit receives an input signal through an input terminal, generates a shifted input signal shifted in voltage from the input signal by a predetermined shift amount, and outputs the shifted input signal from an output terminal. The LD driver circuit also includes a transistor with its base receiving the shifted input signal, its collector electrically connected to an anode of a driven LD, and its emitter electrically connected to a cathode of the LD and ground, which transistor varies an amount of a shunt current flowing from the collector to the emitter in accordance with the shifted input signal. The adjustment circuit includes a comparator which compares a voltage in the collector and a threshold voltage, and increases or decreases the predetermined shift amount in accordance with an output of the comparator.

8 Claims, 15 Drawing Sheets

LASER DRIVER CIRCUIT AND OPTICAL TRANSMITTER USING THE SAME

TECHNICAL FIELD

An aspect of the present invention relates to a laser driver circuit for optical communication and an optical transmitter using the same.

BACKGROUND

Various configurations are known for a driver circuit to drive a laser diode (which will hereinafter be referred to as an LD) for modulating intensity of an optical signal emitted by the LD. For example, Patent Literature 1 (Japanese Unexamined Patent Publication No. 2005-33019) discloses a shunt driver circuit which includes a transistor, a drain of which is connected to an anode of an LD, a source of which is connected to a cathode of the LD, and a gate of which is supplied with a modulation signal. Such a driver circuit outputs a shunt current, which is bypassed (shunted) from the bias current to generate a drive current of the LD in accordance with a modulation signal, so that the intensity of an optical signal emitted from the LD is modulated by the drive current. In addition, Patent Literature 2 (Japanese Unexamined Patent Publication No. 2007-266493) also discloses a similar configuration of a driver circuit.

In the foregoing shunt driver circuit in the related art, supplying of a bias current to an LD is sometimes stopped in order to shut off an optical signal. Supply stop of a bias current disables laser oscillation, so that the LD stops emitting an optical signal. In this case, in a transistor of a driver circuit, there are cases in which useless currents flow from a gate (base) toward a semiconductor substrate or a source (emitter). Therefore, power consumption tends to be ineffectively increased in a driver circuit. It is preferable that such useless power consumption be reduced.

SUMMARY

According to an aspect of the present invention, there is provided a laser driver circuit configured to output a shunt current for driving a laser diode in accordance with an input signal. The laser driver circuit includes an adjustment circuit having an input terminal and an output terminal, being applied a power supply voltage to, the input terminal receiving the input signal, the adjustment circuit being configured to generate a shifted input signal that is shifted in voltage from the input signal by a predetermined shift amount and output the shifted input signal from the output terminal; and a transistor having a control terminal, a first current terminal, and a second current terminal, the control terminal receiving the shifted input signal, the first current terminal being electrically connected to an anode of the laser diode, the second current terminal being electrically connected to a cathode of the laser diode and a ground, the transistor being configured to vary an amount of the shunt current flowing from the first current terminal to the second current terminal in accordance with the shifted input signal. The adjustment circuit includes a comparator configured to compare a voltage in the first current terminal of the transistor and a threshold voltage, and is configured to increase or decrease the predetermined shift amount in accordance with an output of the comparator.

Alternatively, according to another aspect of the present invention, there is provided an optical transmitter including the laser driver circuit described above, the laser diode which is driven by the laser driver circuit, and a current source being connected to a portion between a power supply line being applied a power supply voltage to and the anode of the laser diode, and configured to supply a direct current from the power supply line toward the anode of the laser diode.

DETAILED DESCRIPTION

Hereinafter, an embodiment of the present invention will be described with reference to the drawings. The same reference signs are applied to the same elements in description of the drawings, and duplicated description will be omitted.

Figure 1:
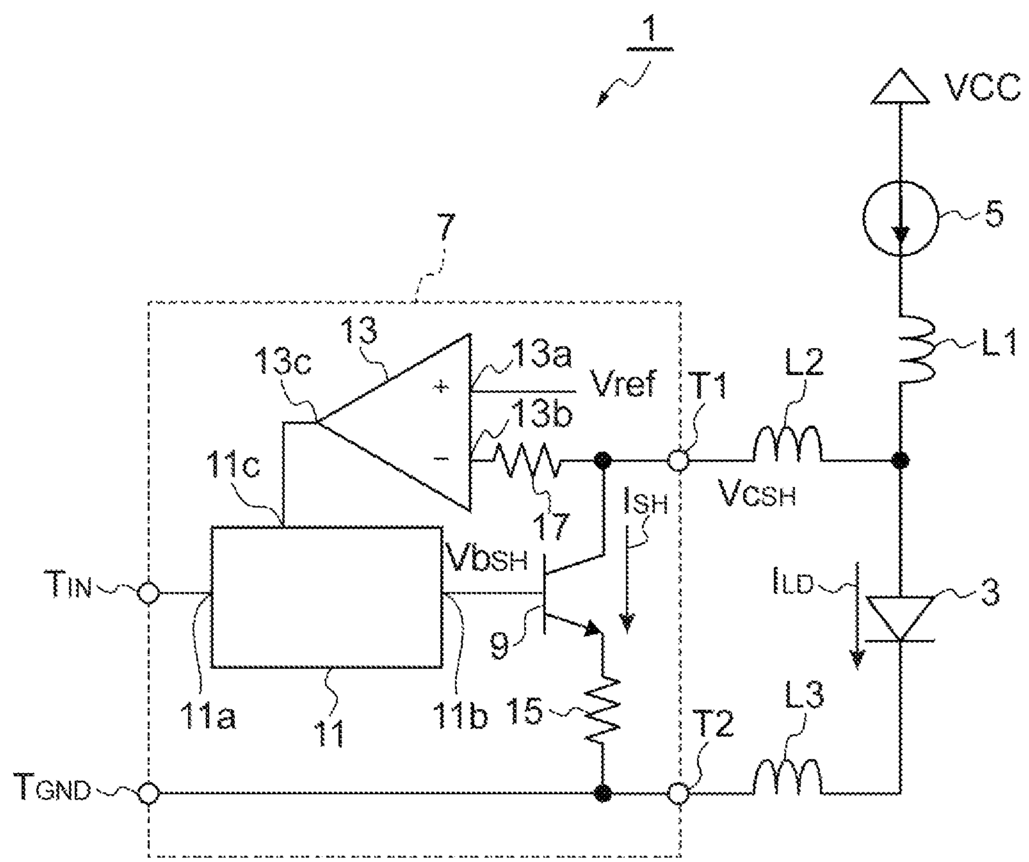
FIG. 1 is a circuit diagram illustrating a configuration of an optical transmitter according to an embodiment.

FIG. 1 is a circuit diagram illustrating a configuration of an optical transmitter 1 according to the embodiment. The optical transmitter 1 illustrated in FIG. 1 is used in optical communication and is a device for transmitting an optical signal intensity-modulated based on an input signal (data signal). The optical transmitter 1 is configured to include an LD 3, a current source 5 which supplies a bias current to the LD 3, and an LD driver circuit (laser driver circuit) 7 which drives the LD 3.

The current source 5 is provided between a power supply line, to which a power supply voltage VCC is applied, and an anode of the LD 3. The power supply voltage VCC is applied to one end of the current source 5 from outside via the power supply line. For example, the anode of the LD is electrically connected to the other end of the current source 5 via a bonding wire L1 having an inductance component. This current source 5 supplies a bias current Ibias having a predetermined value toward the anode of the LD 3. The bias current is set to a constant value in normal operation and flows from one end toward the other end. For example, the bias current Ibias is set to 60 mA. A circuit element having an inductance component such as a chip inductor may be interposed between the current source 5 and the bonding wire L1 for more stabilization.

The LD driver circuit 7 has a first terminal T1, a second terminal T2, an input terminal (third terminal) $T_{IN}$, and a ground terminal $T_{GND}$. The first terminal T1 is electrically connected to the anode of the LD 3 via a bonding wire L2 having an inductance component. The second terminal T2 is electrically connected to a cathode of the LD via a bonding wire L3 having an inductance component. The input terminal (third terminal) $T_{IN}$ receives an input voltage signal (input signal) $V_{IN}$ for modulating an optical signal that is emitted from the LD 3. The ground terminal $T_{GND}$ is electrically connected to the ground (ground potential), and the ground potential is provided to the LD driver circuit 7. This LD driver circuit 7 is a circuit which outputs a shunt current for driving the LD 3 in accordance with the input voltage signal $V_{IN}$. For example, the LD driver circuit 7 is configured to include a transistor 9, a voltage adjustment circuit 11, and a comparator (voltage comparator) 13.

The transistor 9 of the LD driver circuit 7 may be a bipolar transistor such as a heterojunction bipolar transistor (HBT) or may be a field effect transistor (FET). In the case of a bipolar transistor, the transistor 9 has a base serving as a control terminal for controlling a switching operation of the transistor and has a collector and an emitter respectively serving as two current terminals (first and second current terminals) through which the shunt current flows. For example, the amount of a collector current (shunt current) flowing from the collector to the emitter varies in accordance with a base voltage applied to the base. On the other hand, in the case of a field effect transistor, the transistor 9 has a gate serving as a control terminal and has a drain and a source respectively serving as two current terminals through which the shunt current flows. For example, the amount of a drain current (shunt current) flowing from the drain to the source varies in accordance with a gate voltage applied to the gate. Hereinafter, a case in which the transistor 9 is a bipolar transistor will be described as an example.

The collector of the transistor 9 is electrically connected to the first terminal T1. The emitter of the transistor 9 is electrically connected to the second terminal T2 and the ground terminal $T_{GND}$ via a resistance element 15. The resistance element 15 will be referred to as emitter resistor. Moreover, the base of the transistor 9 is electrically connected to an output terminal 11*b* of the voltage adjustment circuit 11. That is, the transistor 9 works like a grounded emitter circuit.

The comparator 13 has two inputs constituted of a non-inverting input 13*a* and an inverting input 13*b*, and an output 13*c*. The comparator 13 outputs a comparative voltage, which is obtained by comparing a voltage input to the non-inverting input 13*a* and a voltage input to the inverting input 13*b*, to the output 13*c*. That is, the comparator 13 outputs a high voltage (for example, the power supply voltage VCC) when a voltage input to the non-inverting input 13*a* is higher than a voltage input to the inverting input 13*b*. The comparator 13 outputs a low voltage (for example, 0 V) when a voltage input to the non-inverting input 13*a* is lower than a voltage input to the inverting input 13*b*. The comparator 13 outputs an intermediate voltage between the high voltage and the low voltage when the voltage input to the non-inverting input 13*a* has a value in voltage substantially equal to a value in voltage of the voltage input to the inverting input 13*b*. A default threshold voltage Vref is applied to the non-inverting input 13*a* of the comparator 13, and the collector of the transistor 9 is electrically connected to the inverting input 13*b* of the comparator 13 via a resistance element 17. For example, the comparator 13 is an operational amplifier (differential amplifier). The threshold voltage Vref applied to the comparator 13 is a constant voltage and is set to a value (for example, 0.5 V) smaller than an average voltage (for example, 1.5 V) of the collector of the transistor 9 in normal operation. Since the comparator 13 compares two voltage values to each other, it is also referred to as a voltage comparator.

For example, as a configuration for generating the threshold voltage Vref from the power supply voltage VCC, a resistive voltage divider is employed. Due to such a configuration, a circuit can be simplified and the total power consumption can be reduced. The comparator 13 is not required to be able to follow a collector voltage of the transistor 9 which rapidly changes up to a frequency such as several tens of GHz. The comparator 13 may have a response speed of a micro-second order sufficient to detect an intermediate voltage (average voltage) of the collector voltage. In other words, the frequency band of the comparator 13 may be in mega-hertz order. Electrically connecting the inverting input 13*b* of the comparator 13 to the collector of the transistor 9 via the resistance element 17 can prevent input capacitance of the comparator 13 from degrading high-speed performance of the optical signal. That is, when impedance of the comparator 13 seen from the collector of the transistor 9 is increased by moderately increasing the resistance value of the resistance element 17, an influence of the input capacitance (capacitance) or the like of the inverting input 13*b* of the comparator 13 on a switching operation of the collector of the transistor 9 can be suppressed. For example, the resistance value of the resistance element 17 may be set to several kiloohms (KΩ) or higher, when the collector voltage is detected at several MHz or lower.

The voltage adjustment circuit 11 has an input terminal 11*a*, the output terminal 11*b*, and a control terminal 11*c*. The input terminal 11*a* is electrically connected to the input terminal $T_{IN}$. The output terminal 11*b* is electrically connected to the base of the transistor 9. The control terminal 11*c* is electrically connected to the output 13*c* of the comparator 13. This voltage adjustment circuit 11 adjusts the average voltage (direct voltage) of input voltage signal $V_{IN}$ such that the average current of shunt currents $I_{SH}$ flowing from the collector to the emitter in the transistor 9 is set to a default value to adjust the optical signal of the LD 3. This voltage adjustment circuit 11 outputs the input voltage signal $V_{IN}$, of which the average voltage (direct voltage) is adjusted, from the output terminal 11*b* as an adjusted voltage signal (shifted signal) $Vb_{SH}$, and the voltage adjustment circuit 11 applies the adjusted voltage signal $Vb_{SH}$ to the base of the transistor 9.

Moreover, the voltage adjustment circuit 11 generates the adjusted voltage signal $Vb_{SH}$ such that the average voltage (direct voltage) thereof is increased or decreased in accordance with a comparative voltage output from the comparator 13. Specifically, for example, the voltage adjustment circuit 11 outputs the adjusted voltage signal $Vb_{SH}$ as the input voltage signal $V_{IN}$ obtained by shifting the average voltage as much as a predetermined shift amount when the output of the comparator 13 is a high voltage, and the voltage adjustment circuit 11 outputs the adjusted voltage signal $Vb_{SH}$ as the input voltage signal $V_{IN}$ obtained by shifting the average voltage as much as a predetermined shift amount when the output of the comparator 13 is a low voltage. More specifically, the voltage adjustment circuit 11 sets the average voltage of the adjusted voltage signal $Vb_{SH}$ such that the transistor 9 works in normal operation and the average current of the shunt currents $I_{SH}$ is set to the default value, when the comparator 13 outputs a low voltage. On the other hand, the average voltage of the adjusted voltage signal $Vb_{SH}$ is set to a predetermined voltage (for example, 0.4 V), when the comparator 13 outputs a high voltage. That is, the average voltage of the adjusted voltage signals $Vb_{SH}$ when the comparator 13 outputs a high voltage is set to be lower than the average voltage of the adjusted voltage signals $Vb_{SH}$ when the comparator 13 outputs a low voltage.

Figure 2A:
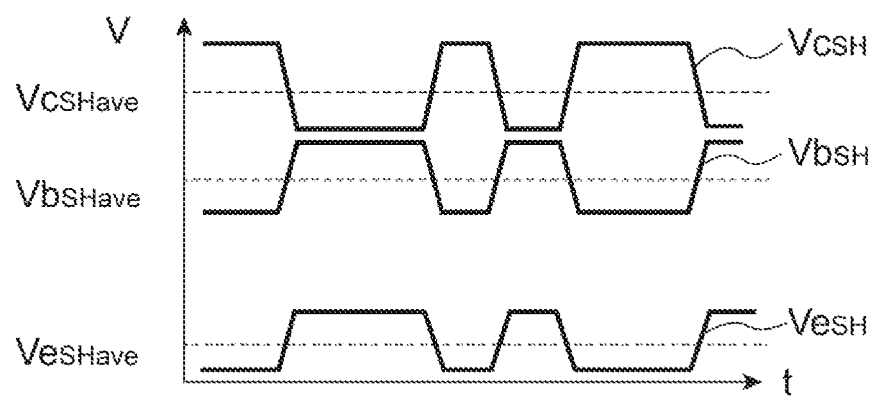
FIG. 2A is a graph illustrating an example of voltage signals of terminals of a transistor 9 included in an LD driver circuit 7.
Figure 2B:
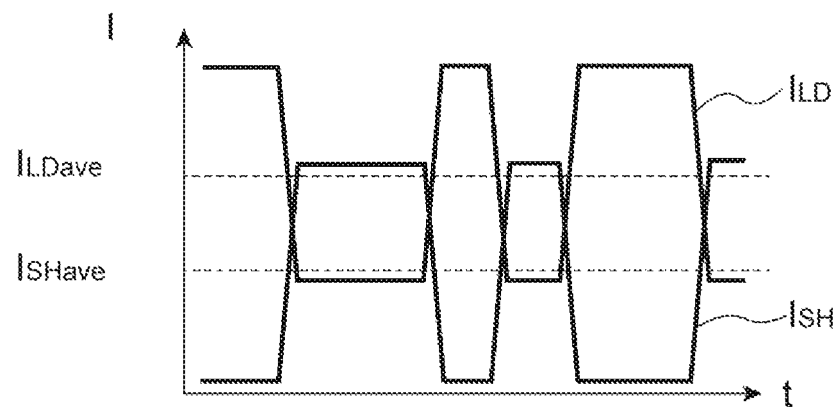
FIG. 2B is a graph illustrating an example of current signals respectively flowing in an LD 3 and the transistor 9.
Figure 3:
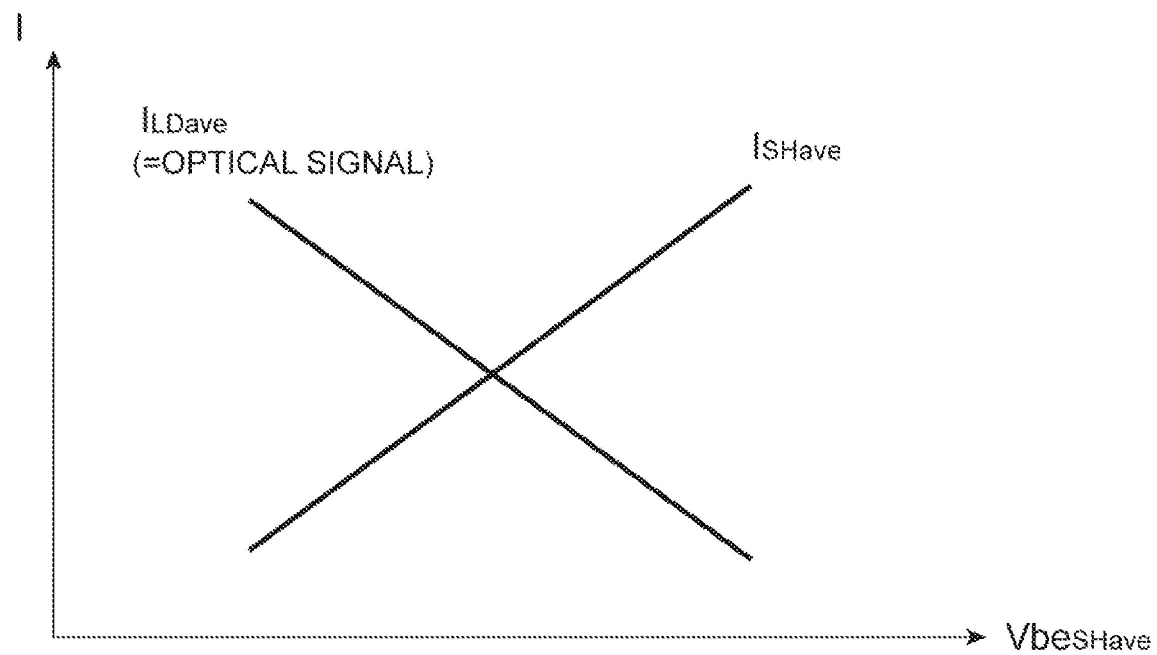
FIG. 3 is a graph illustrating a relationship between an average base-emitter voltage of the transistor 9, and an average drive current flowing in the LD 3 and an average shunt current flowing in the transistor 9.

FIG. 2A illustrates an example of voltage signals of terminals of the transistor 9 included in the LD driver circuit 7, and FIG. 2B illustrates an example of current signals respectively flowing in the LD 3 and the transistor 9. FIG. 3 illustrates a relationship between an average base-emitter voltage $Vbe_{SHave}$ of the transistor 9 and the average currents flowing in the LD 3 and the transistor 9.

In the optical transmitter 1 having the foregoing configuration, the bias current Ibias is supplied from the current source 5 toward the anode of the LD 3. This bias current Ibias flows to the anode of the LD 3 when the transistor 9 is in an off-state. That is, a drive current $I_{LD}$ becomes equivalent to the bias current Ibias. When the transistor 9 is in an off-state, the shunt current $I_{SH}$ becomes zero. When the transistor 9 is in an on-state, the bias current Ibias is divided into the shunt current $I_{SH}$ flowing from the collector to the emitter of the transistor 9 of the LD driver circuit 7 and the drive current $I_{LD}$ flowing from the anode to the cathode of the LD 3. That is, the relationship of $Ibias=I_{SH}+I_{LD}$ is derived. When the transistor 9 is in an off-state, the shunt current $I_{SH}$ becomes zero with the relationship of $Ibias=I_{LD}$ as described above. Therefore, the relationship of $Ibias=I_{SH}+I_{LD}$ is satisfied when the transistor 9 is either in an off-state or in an on-state. When the optical transmitter 1 transmits an optical signal, the bias current Ibias is set to a constant value. Therefore, in such a case, if the shunt current $I_{SH}$ is increased, the drive current $I_{LD}$ is decreased. In addition, if the shunt current $I_{SH}$ is decreased, the drive current $I_{LD}$ is increased. This relationship can be described as follows based on a high level (a state of a large current value) and a low level (a state of a small current value) of a logical value. The drive current $I_{LD}$ is at a low level when the shunt current $I_{SH}$ is at a high level, and the drive current $I_{LD}$ is at a high level when the shunt current $I_{SH}$ is at a low level. That is, the drive current $I_{LD}$ has a relationship in which the logical value is inverted from the shunt current $I_{SH}$. In this case, when the input voltage signal $V_{IN}$, of which the voltage value in accordance with a data signal transmitted by the optical transmitter 1, is adjusted to the adjusted voltage signal $Vb_{SH}$ and is then applied to the base of the transistor 9 (FIG. 2A), the shunt current $I_{SH}$ varies in accordance therewith, and the drive current $I_{LD}$ simultaneously changes in accordance with the input voltage signal $V_{IN}$. As a result (FIG. 2B), the optical signal emitted by the LD 3 is modulated. For example, the relationship between operations of signals can be described as follows based on the high level (which will hereinafter be abbreviated to "high") and the low level (which will hereinafter be abbreviated to "low") of a logical value. Since the shunt current $I_{SH}$ becomes low (or high) when the adjusted voltage signal $Vb_{SH}$ is low (or high), the drive current $I_{LD}$ becomes high (or low), and the optical signal is in a state of data "1" (or "0"). Here, "1" expresses a state of significant power of the optical signal that is output from an LD (emission state), and "0" expresses a state of small power of the optical signal that is output from an LD (extinction state). A voltage $Vc_{SH}$ of the collector of the transistor 9 also varies in association with the drive current $I_{LD}$, and an emitter voltage $Ve_{SH}$ of the emitter of the transistor 9 also varies in association with the shunt current $I_{SH}$. In this case, the average voltages related to the collector voltage $Vc_{SH}$, the base voltage $Vb_{SH}$, and the emitter voltage $Ve_{SH}$ of the transistor 9 are $Vc_{SHave}$, $Vb_{SHave}$, and $Ve_{SHave}$, respectively. Here, each average voltage shown by broken lines in FIG. 2A represents each direct voltage of voltage signals shown by solid lines in FIG. 2A. The average currents related to the shunt current $I_{SH}$ and the drive current $I_{LD}$ are $I_{SHave}$ and $I_{LDave}$, respectively. Accordingly, the average currents $I_{SHave}$ and $I_{LDave}$ corresponds to respective direct voltages (broken lines in FIG. 2B) of the shunt current $I_{SH}$ and the drive current $I_{LD}$ (solid lines in FIG. 2B). In this manner, since the transistor 9 increases or decreases the drive current $I_{LD}$ by shunting the shunt current $I_{SH}$ from the bias current Ibias in accordance with the adjusted voltage signal $Vb_{SH}$, it is also referred to as a shunt transistor. In addition, a driving method in which the LD 3 is driven by using a shunt transistor is referred to as shunt driving. A driver circuit performing shunt driving is referred to as a shunt driver circuit.

The voltage adjustment circuit 11 of the LD driver circuit 7 has a function of adjusting a ratio of the shunt current $I_{SH}$ to the bias current Ibias. That is, the average value $I_{SHave}$ of the shunt currents $I_{SH}$ is increased as the average voltage $Vbe_{SHave}$ (nearly equal to the average voltage $Vb_{SHave}$ of the adjusted voltage signals $Vb_{SH}$) of the base-emitter voltages $Vbe_{SH}$ of the transistor 9 (nearly equal to the adjusted voltage signal $Vb_{SH}$) is adjusted to be increased. As a result, the average value $I_{LDave}$ of the drive currents $I_{LD}$ conversely becomes small due to the inverted relationship described above. In addition, the average value $I_{SHave}$ of the shunt currents $I_{SH}$ becomes small as the average voltage $Vbe_{SHave}$ of the base-emitter voltages $Vbe_{SH}$ is adjusted to be small. As a result, the average value $I_{LDave}$ of the drive currents $I_{LD}$ is conversely increased due to the inverted relationship described above (FIG. 3). In this manner, the voltage adjustment circuit 11 can adjust the optical signal by adjusting the average voltage $Vb_{SHave}$ of the adjusted voltage signals $Vb_{SH}$ and regulating the average value $I_{SHave}$ of the shunt currents $I_{SH}$.

Figure 4:
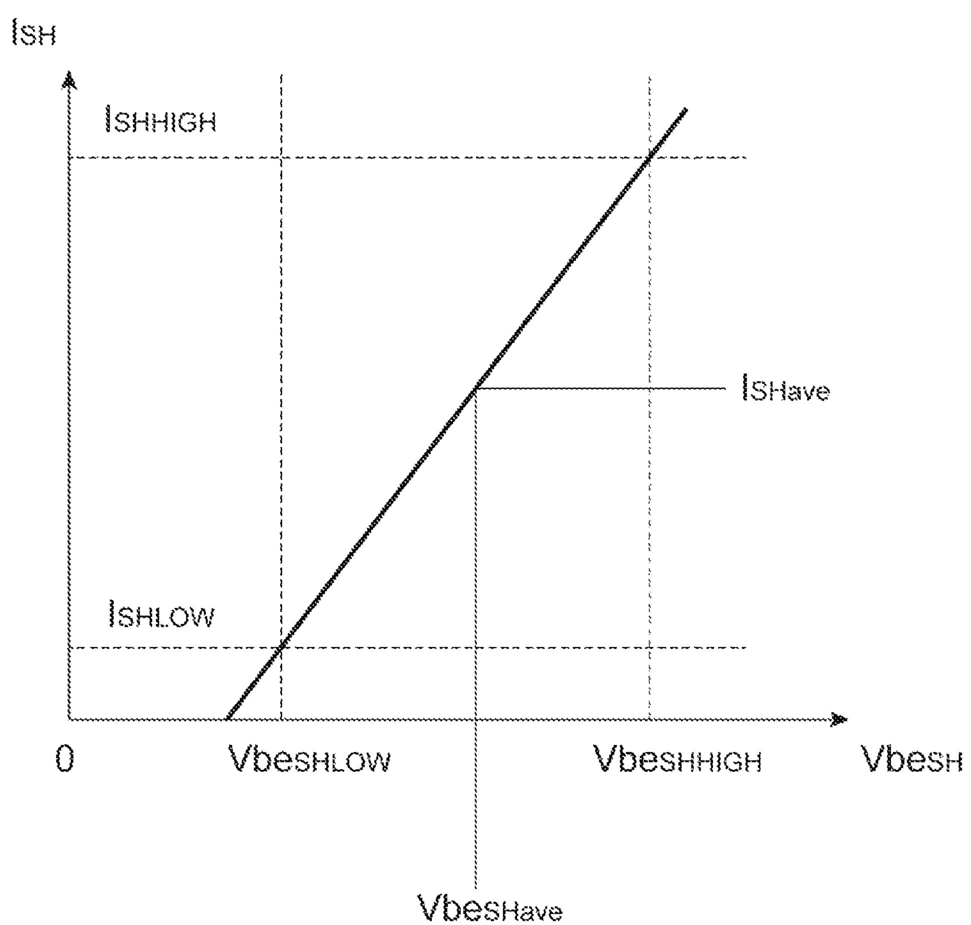
FIG. 4 is a graph illustrating a relationship between the base-emitter voltage and a shunt current flowing in the transistor 9.
Figure 5:
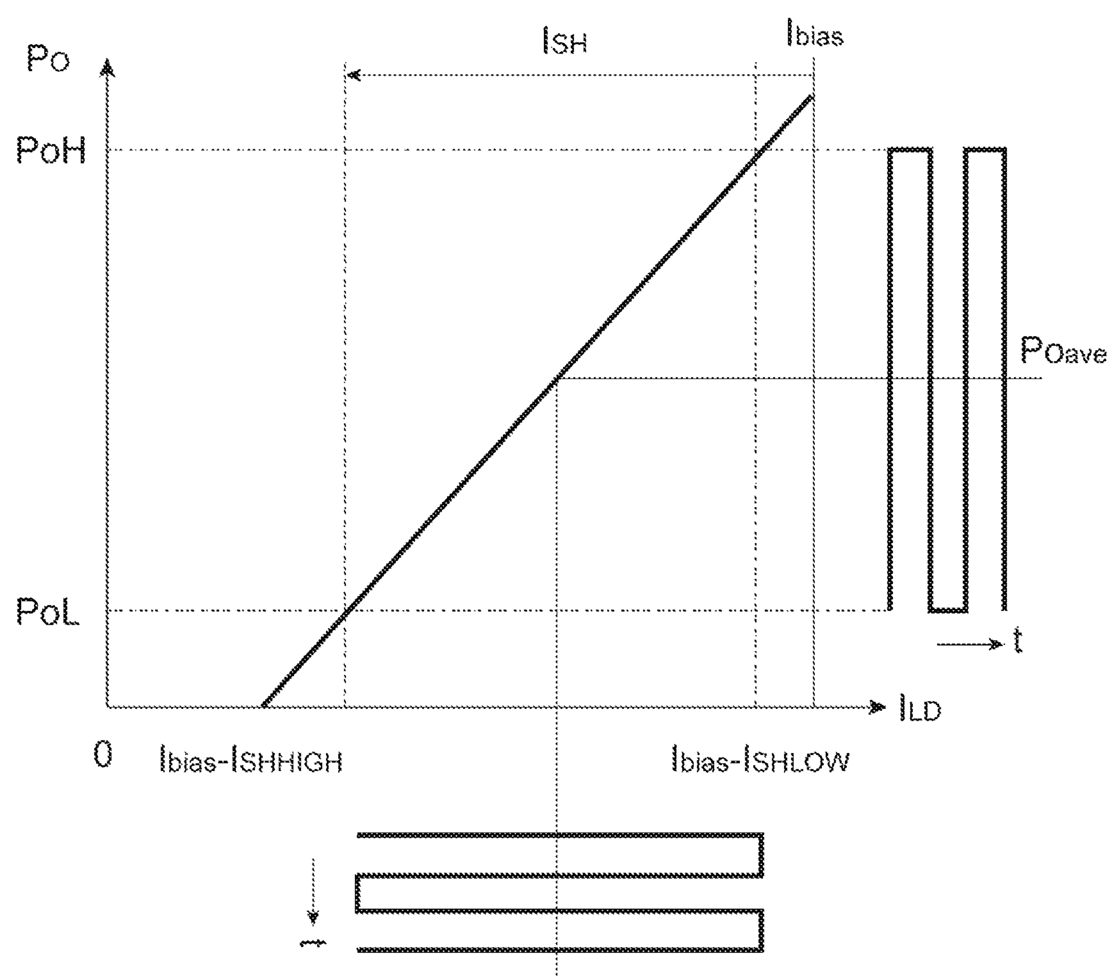
FIG. 5 is a graph illustrating a relationship between a drive current supplied to the LD 3 and optical output power.

FIG. 4 illustrates a relationship between the base-emitter voltage $Vbe_{SH}$ in the transistor 9 and the shunt current $I_{SH}$, and FIG. 5 illustrates a relationship between the drive current $I_{LD}$ and optical output power Po.

The base-emitter voltage $Vbe_{SH}$ of the transistor 9 varies between a lowest voltage (low level) $Vbe_{SHLOW}$ and a highest voltage (high level) $Vbe_{SHHIGH}$ in accordance with a change in the input voltage signal $V_{IN}$, and the shunt current $I_{SH}$ varies between a lowest current (a low level in the current value) $I_{SHLOW}$ and a highest current (a high level in the current value) $I_{SHHIGH}$ in accordance therewith. The base-emitter voltage $Vbe_{SH}$ may be equal to the low level $Vbe_{SHLOW}$ or the high level $Vbe_{SHHIGH}$. Also, the shunt current $I_{SH}$ may be equal to the low level $I_{SHLOW}$ or the high level $I_{SHHIGH}$. In this case, the average current $I_{SHave}$ of the shunt currents $I_{SH}$ is set in a manner corresponding to the average voltage $Vbe_{SHave}$ of the base-emitter voltages $Vbe_{SH}$.

The drive current $I_{LD}$ varies between a lowest value Ibias−$I_{SHHIGH}$ and a highest value Ibias−$I_{SHLOW}$ in accordance with the shunt current $I_{SH}$, and the optical output power Po varies between a lowest value PoL and a highest value PoH in accordance therewith. In this case, an average value $Po_{ave}$ of the optical output power Po is set to a desired value in a manner corresponding to the average value of the shunt currents $I_{SH}$.

Figure 6:
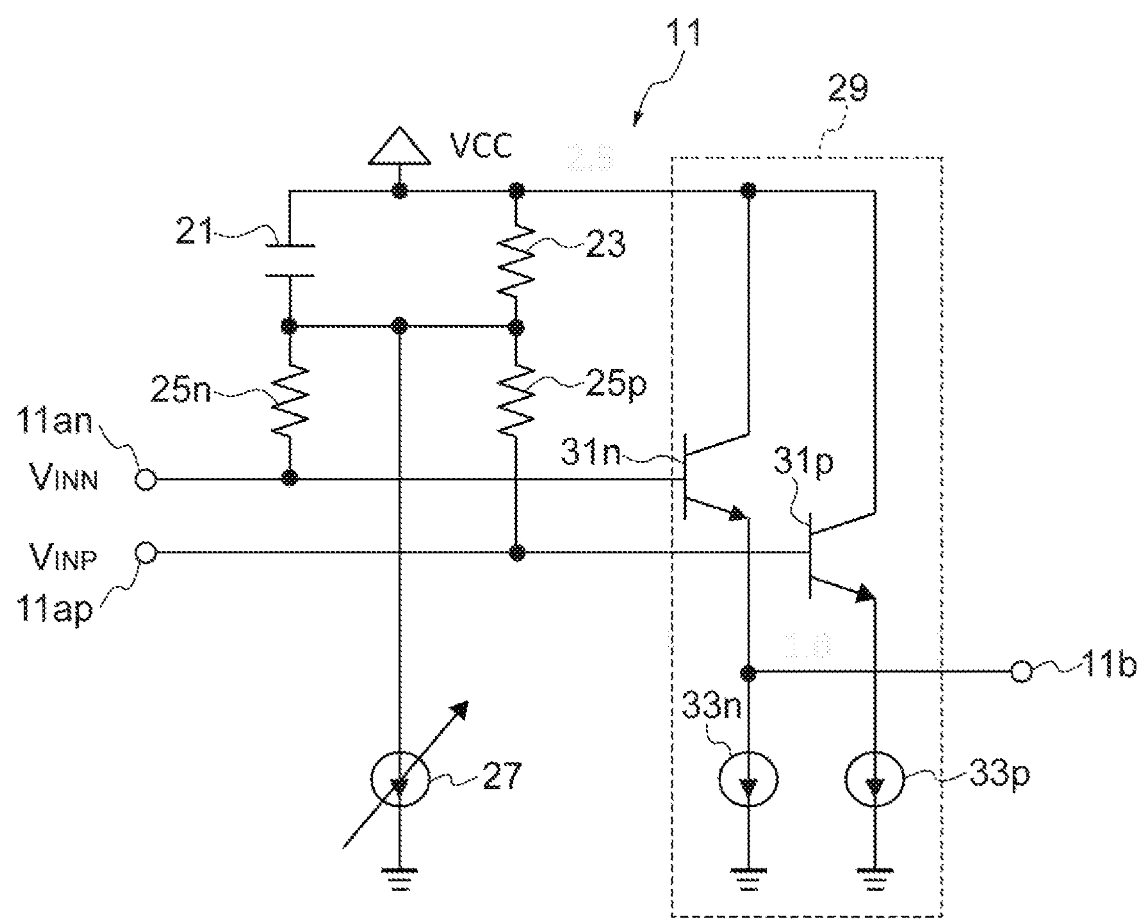
FIG. 6 is a circuit diagram illustrating an example of a circuit configuration of a voltage adjustment circuit 11.

Here, a specific example of a circuit configuration of the voltage adjustment circuit 11 will be described. FIG. 6 is a circuit diagram illustrating an example of a circuit configuration of the voltage adjustment circuit 11. Various configurations of the voltage adjustment circuit 11 can be considered depending on the circuit system in a previous stage of the LD driver circuit 7 or the system of the input voltage signal $V_{IN}$ (for example, the circuit configuration of an output circuit). The configuration illustrated in FIG. 6 is a configuration corresponding to a case in which the input voltage signal $V_{IN}$ is a differential input including a positive phase signal $V_{INP}$ and a negative phase signal $V_{INN}$ complementary to each other (having phases opposite to each other). Here, for example, the term "complementary" denotes a state in which when one (positive phase signal) of two signals is increased, the other one (negative phase signal) of the two signals is decreased, and when one of the two signals is decreased, the other one of the two signals is increased. In addition, in a case in which two signals are complementary to each other, when one signal reaches the maximum value (peak value), the other signal becomes the minimum value (bottom value). On the contrary, when one signal reaches the minimum value (bottom value), the other signal becomes the maximum value (peak value). The amplitude of the positive phase signal $V_{INP}$ is substantially equal to the amplitude of the negative phase signal $V_{INP}$ and the average voltage of the positive phase signals $V_{INP}$ is substantially equal to the average voltage of the negative phase signals $V_{INN}$.

That is, as the input terminal 11*a*, the voltage adjustment circuit 11 has an input terminal 11*an* to which the negative phase signal $V_{INN}$ is input and an input terminal 11*ap* to which the positive phase signal $V_{INP}$ is input. The voltage adjustment circuit 11 is constituted of a capacitor 21, resistance elements 23, 25*n*, and 25*p*, a current source circuit 27, and an emitter follower circuit 29.

The power supply voltage VCC is applied to one end of the capacitor 21 and one end of the resistance element 23 via the power supply line. One end of each of two resistance elements 25*n* and 25*p* is electrically connected to the other end of each of the capacitor 21 and the resistance element 23 and is further connected to the ground potential via the current source circuit 27. The other end of each of two resistance elements 25*n* and 25*p* is electrically connected to each of the input terminals 11*an* and 11*ap* and is also electrically connected to the emitter follower circuit 29.

The current source circuit 27 is configured to adjust a current value Icomm flowing in the resistance element 23 such that the average current of the shunt currents $I_{SH}$ of the transistor 9 is set to a default value. Each of the resistance elements 25*n* and 25*p* is resistor for matching the characteristic impedance of transmission lines respectively connected to the input terminals 11*an* and 11*ap* with the input impedance of the voltage adjustment circuit 11. A current source included in the voltage adjustment circuit 11 can be provided through various known circuit configurations. In the following description, a current source configured using an HBT will be described as an example.

The emitter follower circuit 29 includes transistors 31*n* and 31*p* constituted of two bipolar transistors, and current sources 33*n* and 33*p*. The power supply voltage VCC is applied to the collectors of the transistors 31*n* and 31*p* via the power supply line. Each of the input terminals 11*an* and 11*ap* and each of the other ends of the resistance elements 25*n* and 25*p* is electrically connected to the respective bases of the transistors 31*n* and 31*p*. In addition, the emitters of the transistors 31*n* and 31*p* are connected to the ground potential via the current sources 33*n* and 33*p*, respectively. The emitter of the transistor 31*n* is also electrically connected to the output terminal 11*b*. This emitter follower circuit 29 outputs an electrical potential generated at the other end of the resistance element 25*n* to the output terminal 11*b* as the adjusted voltage signal $Vb_{SH}$.

Figure 7:
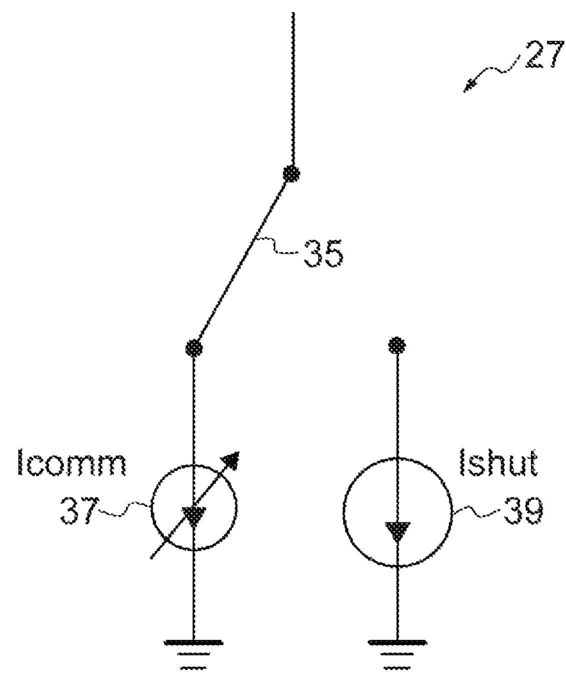
FIG. 7 is a circuit diagram illustrating a schematic configuration of a current source circuit 27 in FIG. 6.
Figure 8:
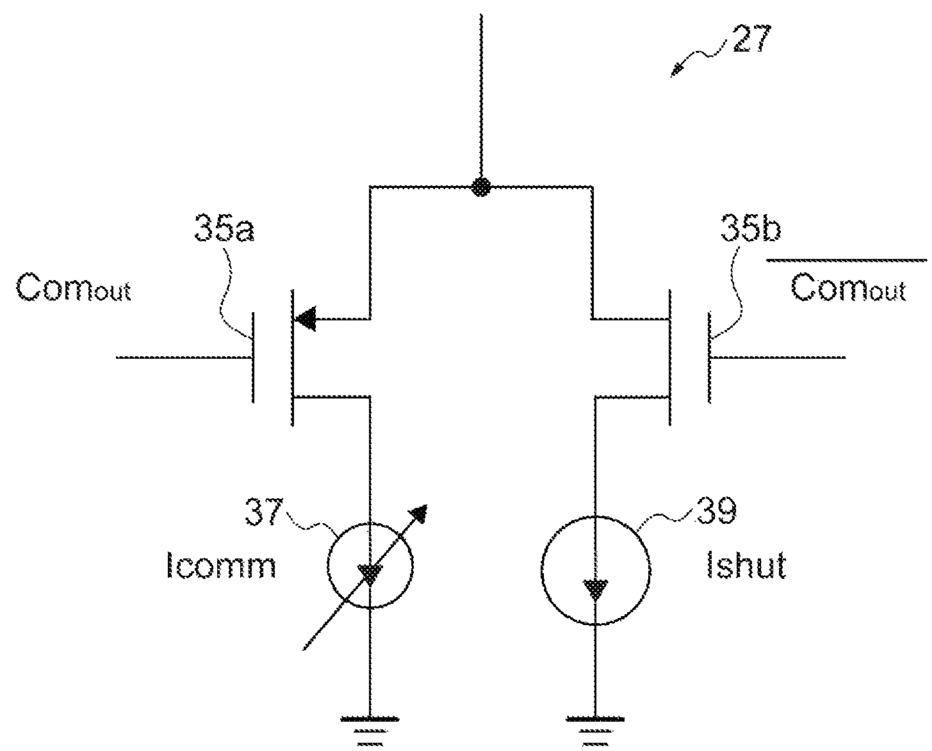
FIG. 8 is a circuit diagram illustrating a specific example of a circuit configuration of the current source circuit 27 in FIG. 7.

FIG. 7 illustrates a schematic configuration of the current source circuit 27, and FIG. 8 illustrates a specific example of a circuit configuration of the current source circuit 27 in FIG. 7.

As illustrated in FIG. 7, the current source circuit 27 is constituted of an electrical switch (switch) 35 and two current sources 37 and 39. The current source 37 can supply a current having the variable current value Icomm, and the current source 39 can supply a current having a current value Ishut larger than the current value Icomm. The electrical switch 35 electrically connects one of the two current sources 37 and 39 to the other end of the resistance element 23. The electrical switch 35 operates to draw a current having either the current value Icomm or Ishut from the resistance element 23 by switching the two current sources 37 and 39 in accordance with a comparative voltage $Com_{out}$ output by the comparator 13. In other words, the electrical switch 35 switches between a first connection and a second connection with a comparative voltage $Com_{out}$ output by the comparator 13. Here, the current source 37 is electrically connected to the resistance element 23 through the first connection and the current source 39 is electrically connected to the resistance element 23 through the second connection. Specifically, the electrical switch 35 is switched to the current source 37 side when the comparative voltage $Com_{out}$ is a low voltage (low level) and is switched to the current source 39 side when the comparative voltage $Com_{out}$ is a high voltage (high level). Such a configuration allows the current source circuit 27 to increase and decrease the variable current value in accordance with the comparative voltage $Com_{out}$.

For example, as illustrated in FIG. 8, the current source circuit 27 is available using a p-channel metal oxide semiconductor (MOS) transistor. In this example, the electrical switch 35 is constituted of two MOS transistors 35*a* and 35*b*. The sources of the MOS transistors 35*a* and 35*b* are electrically connected to the other end of the resistance element 23, and the drains of the MOS transistors 35*a* and 35*b* are connected to the ground potential via the current sources 37 and 39, respectively. When the comparator 13 outputs the state "1" as high level of the comparative voltage $Com_{out}$) and outputs the state "0" as low level of the comparative voltage $Com_{out}$, the MOS transistor 35*a* is configured to be turned on in accordance with the state of the comparative voltage $Com_{out}$, and the MOS transistor 35*b* is configured to be turned on in accordance with the state in which the state of the comparative voltage $Com_{out}$ is inverted. Such a configuration allows the resistance element 23 to be electrically connected to either one of the current source 37 or 39 in accordance with the state of the comparative voltage $Com_{out}$.

The voltage adjustment circuit 11 having the foregoing configuration operates as follows.

When the bias current Ibias of the current source 5 is being supplied and the comparator 13 outputs a low voltage as the comparative voltage $Com_{out}$, the current Icomm flows in the resistance element 23. In this case, when the resistance value of the resistance element 23 is Rcomm and the base-emitter voltage of the transistor 31*n* is $Vbe_{EF}$, the average value $Vb_{SHave}$ of the adjusted voltage signal $Vb_{SH}$ output by the voltage adjustment circuit 11 is expressed by the following expression.

$$Vb_{SHave}=VCC-R\text{comm}\times I\text{comm}-Vbe_{EF}$$

That is, in this case, the voltage adjustment circuit 11 lowers (shifts) the average value $Vb_{SHave}$ of the adjusted voltage signal $Vb_{SH}$ from the power supply voltage VCC by the shift amount of Rcomm×Icomm+$Vbe_{EF}$. On the other hand, when the bias current Ibias of the current source 5 is turned off and the comparator 13 outputs a high voltage as the comparative voltage $Com_{out}$, the current Ishut flows in the resistance element 23. In this case, the average value $Vb_{SHave}$ of the adjusted voltage signal $Vb_{SH}$ output by the voltage adjustment circuit 11 is expressed by the following expression.

$$Vb_{SHave}=VCC-R\text{comm}\times I\text{shut}-Vbe_{EF}$$

That is, in this case, the voltage adjustment circuit 11 lowers (shifts) the average value $Vb_{SHave}$ of the adjusted voltage signal $Vb_{SH}$ from the power supply voltage VCC by the shift amount of Rcomm×Ishut+$Vbe_{EF}$. In this manner, the voltage adjustment circuit 11 alternatively changes the shift amount of the average value $Vb_{SHave}$ of the adjusted voltage signal $Vb_{SH}$ in accordance with the comparative voltage $Com_{out}$.

Since the current value Ishut is set to be larger than the current value Icomm, the shift amount of the adjusted voltage signal $Vb_{SH}$ at the time the bias current Ibias of the current source 5 is stopped can be further increased than the shift amount of the adjusted voltage signal $Vb_{SH}$ at the time the bias current Ibias of the current source 5 is being supplied, so that the average value $Vb_{SHave}$ of the adjusted voltage signals $Vb_{SH}$ can be reduced (for example, to be approximately 0.4 V). Suitably setting these two current values Icomm and Ishut can reduce useless currents in the transistor 9 of the LD driver circuit 7. In addition, when a large current value Ishut is set, the current is reduced due to a decrease in a collector-emitter voltage Vce of the current sources 33*n* and 33*p* of the emitter follower circuit 29, so that power consumption of the voltage adjustment circuit 11 can be reduced. In the current source, of the current sources 37 and 39, on a side turned off by the electrical switch 35, the collector and the emitter of the bipolar transistor constituting the current source are electrically blocked from each other due to the high resistance value, so that no collector current flows therein.

Figure 9:
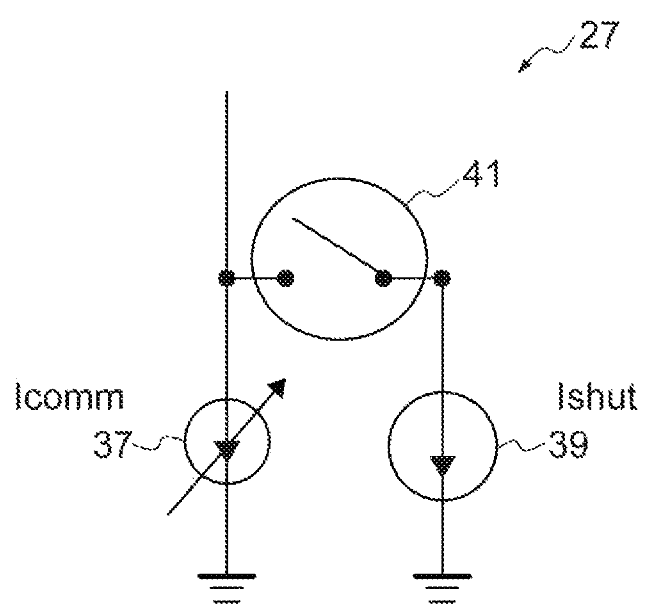
FIG. 9 is a circuit diagram illustrating another configuration of the current source circuit 27 in FIG. 6.

The current source circuit 27 may have a configuration as illustrated in FIG. 9. That is, the current source 37 may be configured to be electrically connected to the other end of the resistance element 23, and only the current source 39 may be electrically connected to the other end of the resistance element 23 via an electrical switch 41. The electrical switch 41 is configured to be turned off when the comparative voltage $Com_{out}$ becomes a low level and to be turned on when the comparative voltage $Com_{out}$ becomes a highlevel. This configuration with the current Icomm stably flowing in the resistance element 23 at all times prevents the average value $Vb_{SHave}$ from being unintentionally increased during switching of the electrical switch.

According to the optical transmitter 1 of the present embodiment described above, the drive current $I_{LD}$ flowing from the anode toward the cathode of the LD 3 is switched in accordance with the adjusted voltage signal $Vb_{SH}$ input to the base of the transistor 9 from the voltage adjustment circuit 11. As a result, an optical signal generated by the LD 3 is modulated. In this case, the voltage adjustment circuit 11 can increase or decrease the average voltage $Vb_{SHave}$ of the adjusted voltage signals $Vb_{SH}$ input to the base of the transistor 9, in accordance with the comparison result between the voltage of the anode of the LD 3 and the threshold voltage Vref. Accordingly, when the bias current Ibias supplied to the LD 3 is turned off and the voltage of the anode of the LD 3 is reduced, the average voltage of the base of the transistor 9 can be decreased, so that useless currents from the base toward a semiconductor substrate or the emitter of the transistor 9 can be suppressed. As a result, useless currents can be prevented from being generated and total power consumption can be reduced.

Effects of the present embodiment will be specifically described in comparison with a comparative example.

Figure 14:
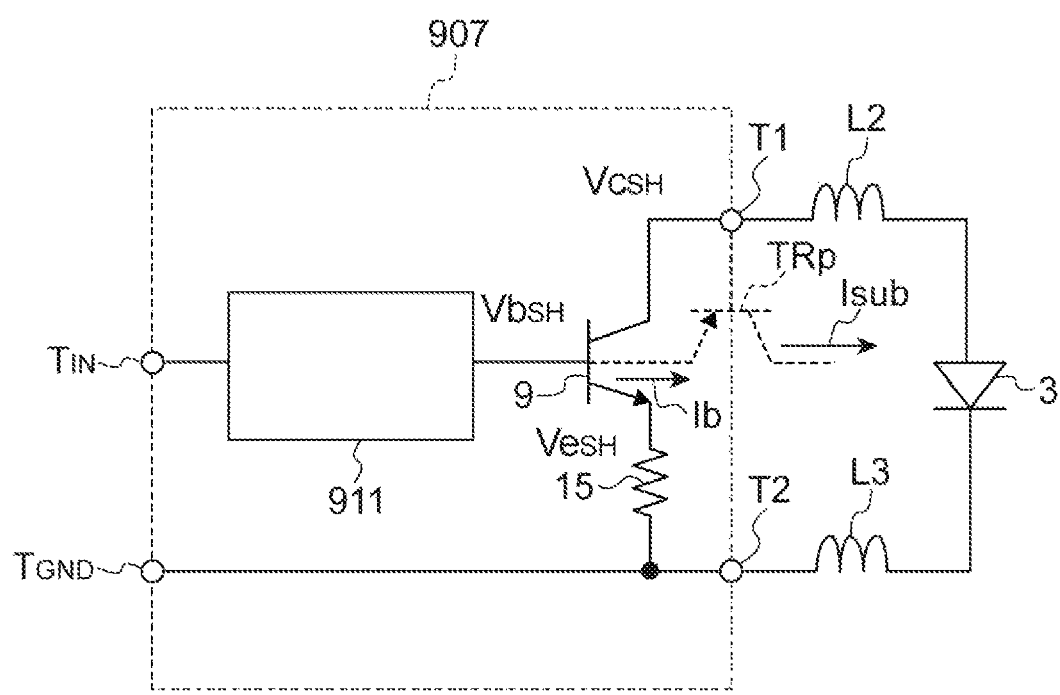
FIG. 14 is a circuit diagram illustrating a configuration of an LD driver circuit 907 according to a comparative example.

A configuration of an LD driver circuit 907 according to the comparative example is illustrated in FIG. 14. The LD driver circuit 907 differs from the LD driver circuit 7 according to the embodiment in not including the comparator 13, and a voltage adjustment circuit 911 does not have a function of increasing or decreasing the average value of the shunt current $I_{SH}$ in accordance with the collector voltage of the transistor 9. In such a LD driver circuit 907, when the bias current Ibias supplied to the LD 3 is turned off (the current source 5 in FIG. 1 is not drawn in FIG. 14, because the current source 5 supplies no bias current), the collector voltage $Vc_{SH}$ of the transistor 9 is reduced to a voltage close to 0 V. In this case, the voltage $Vb_{SH}$ of the average voltage (for example, 0.9 V) similar to that in normal operation is applied from the voltage adjustment circuit 911 to the base of the transistor 9. Therefore, a large current Ib of several milliamperes flows from the base to the emitter of the transistor 9. Base wiring is required to be thickened in order to reduce current density in the base wiring of the transistor 9 with respect to such a large current Ib. As a result, the parasitic capacitance is increased, so that a high-speed performance of the optical transmitter is degraded. Furthermore, in a transistor 9 manufactured through a silicon-based HBT process in which a P-type semiconductor is used as a substrate, a parasitic PNP transistor TRp is formed by a base, a collector, and a substrate. Since a P-N junction formed between the base and the collector of the transistor 9 is biased in a forward direction due to the voltage $Vb_{SH}$ described above, this parasitic PNP transistor TRp is turned on and a substrate current Isub flowing from the base to the substrate is generated. Useless currents are generated in the transistor 9 due to this substrate current Isub as well.

Figure 15:
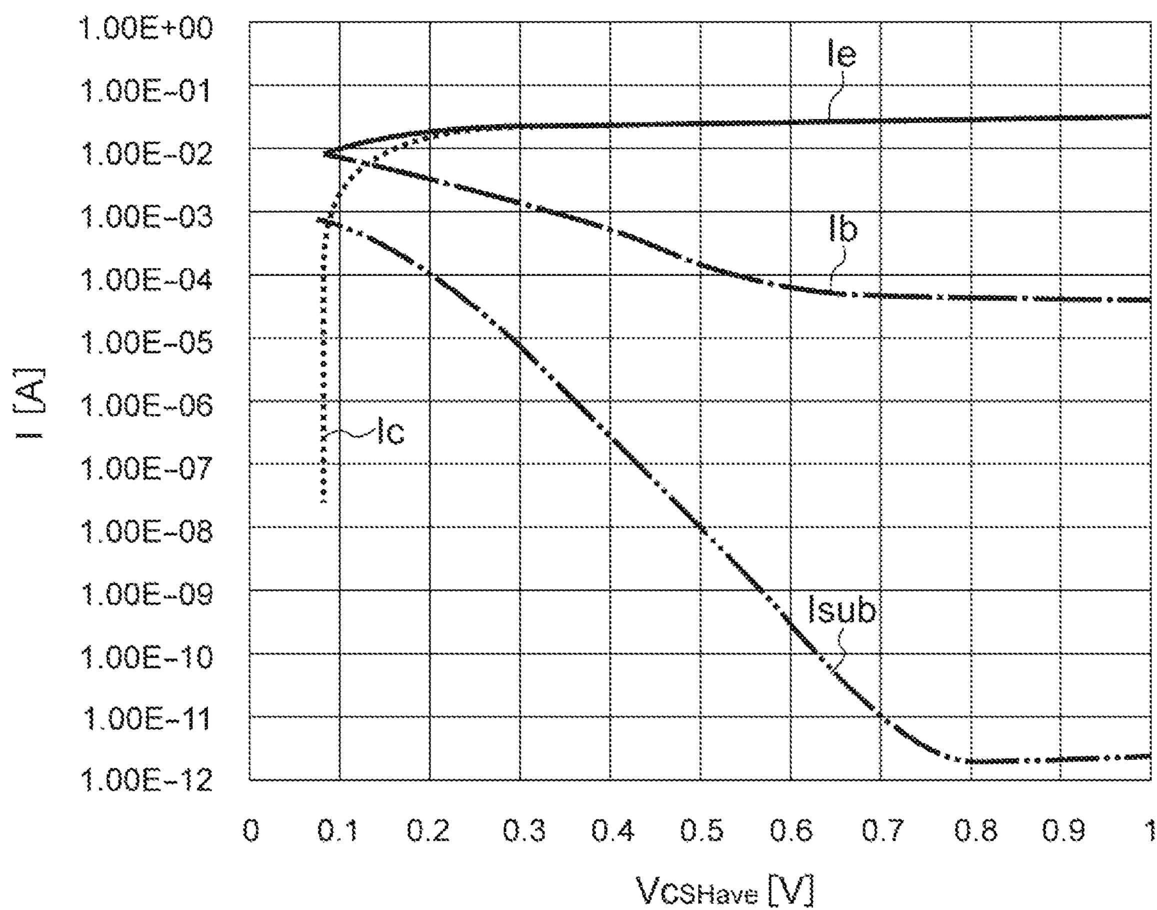
FIG. 15 is a graph illustrating a relationship between the average collector voltage $Vc_{SHave}$ and each of currents flowing in the transistor 9 in a state in which a base voltage $Vb_{SH}$ is fixed, in the transistor 9 of the comparative example.

FIG. 15 illustrates a relationship between the average voltage $Vc_{SHave}$ of the collector voltage $Vc_{SH}$ and each of currents flowing in the transistor 9 of the comparative example in a state that the average value of the base voltage $Vb_{SH}$ is fixed to 0.9 V and just after the bias current Ibias is stopped, in the transistor 9 of the comparative example. Here, the power supply voltage VCC=2.5 V, the resistance value Rcomm=800Ω, and the current value Icomm=0.76 mA are postulated. In the comparative example, it is ascertained that the base current Ib and the substrate current Isub also have a prodigiously large value when Ibias is turned off ($Vc_{SHave}$~0.1 V), compared to a case in which the average voltage $Vc_{SHave}$ is a normal value (>0.9 V).

Figure 10:
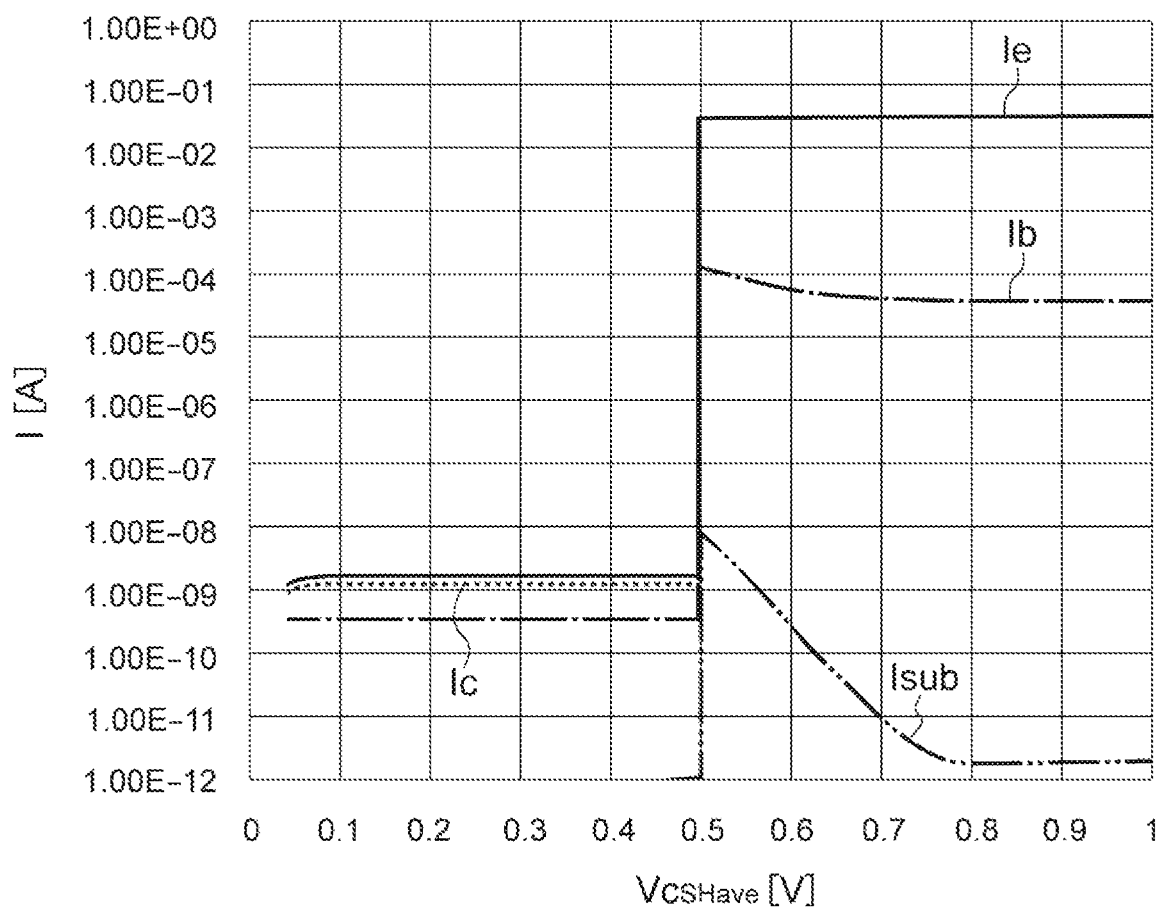
FIG. 10 is a graph illustrating a relationship between an average collector voltage $Vc_{SHave}$ and each of currents flowing in the transistor 9, in the transistor 9 according to the embodiment.

FIG. 10 illustrates a relationship between the average voltage $Vc_{SHave}$ of the collector voltage $Vc_{SH}$ and each of currents flowing in the transistor 9 of the comparative example in a state that the bias current Ibias is just stopped, in the transistor 9 of the present embodiment. Here, the power supply voltage VCC=2.5 V, the resistance value Rcomm=800Ω, the current value Icomm=0.76 mA, and the current value Ishut=1.64 mA are postulated. In the present embodiment, a current flowing in the resistance element 23 is increased or decreased fiducially based on the collector voltage $Vc_{SH}$=0.5 V. In this manner, in the present embodiment, when the average value $Vb_{SHave}$ of the base voltages is decreased to 0.3 V or lower with the collector voltage $Vc_{SH}$<0.5 V, the base current Ib and the substrate current Isub can almost be completely turned off.

Hereinabove, the principle of the present invention has been illustrated and described through a preferable embodiment. However, those skilled in the art recognize that the present invention can be subjected to a change in disposition and details without departing from such a principle. The present invention is not limited to any particular configuration disclosed in the present embodiment. Therefore, present invention claims priority in all of modifications and changes from Claims and the scope of the gist thereof.

Figure 11:
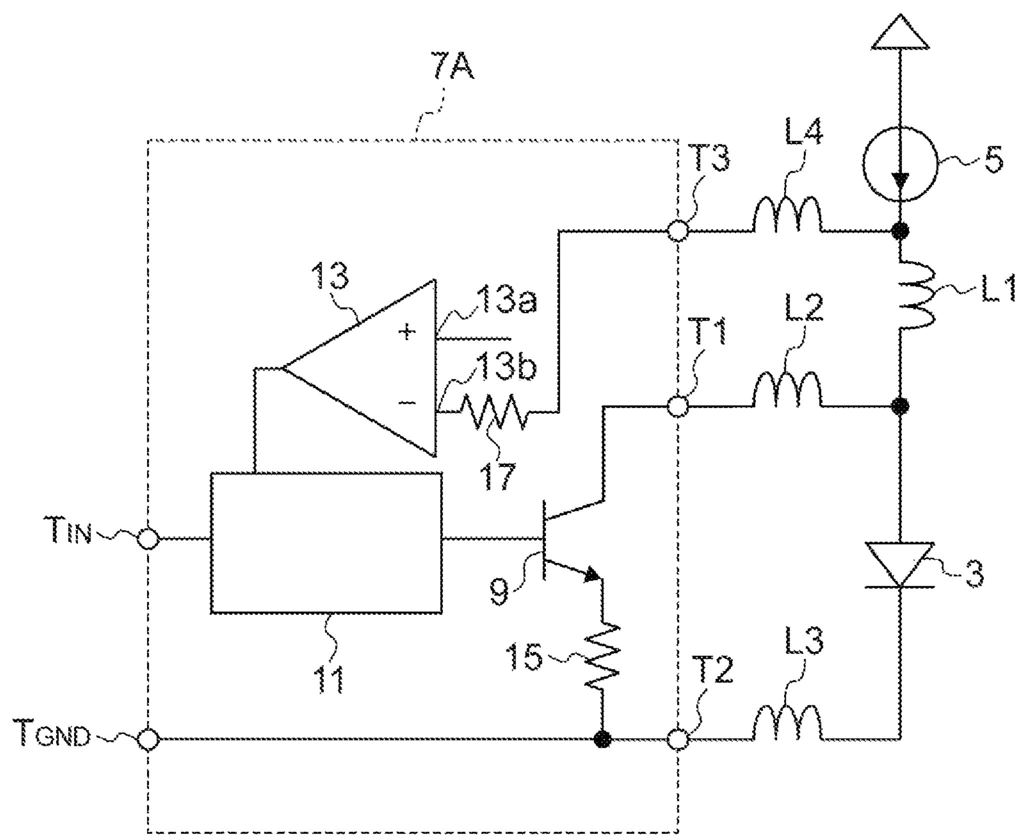
FIG. 11 is a circuit diagram illustrating a configuration of an LD driver circuit 7A according to a modification example.

FIG. 11 illustrates a configuration of an LD driver circuit 7A according to a modification example. The LD driver circuit 7A is configured to further include a third terminal T3. The inverting input 13*b* of the comparator 13 is electrically connected to the third terminal T3 via the resistance element 17. The third terminal T3 is electrically connected to the anode of the LD 3 via wires L4 and L1. According to such a modification example, since no circuit for detecting the average potential of the collector voltages is electrically connected to the collector of the transistor 9, no parasitic capacitance is applied to the collector of the transistor 9. Therefore, an influence on high-frequency characteristics of an optical signal can be further reduced.

Figure 12:
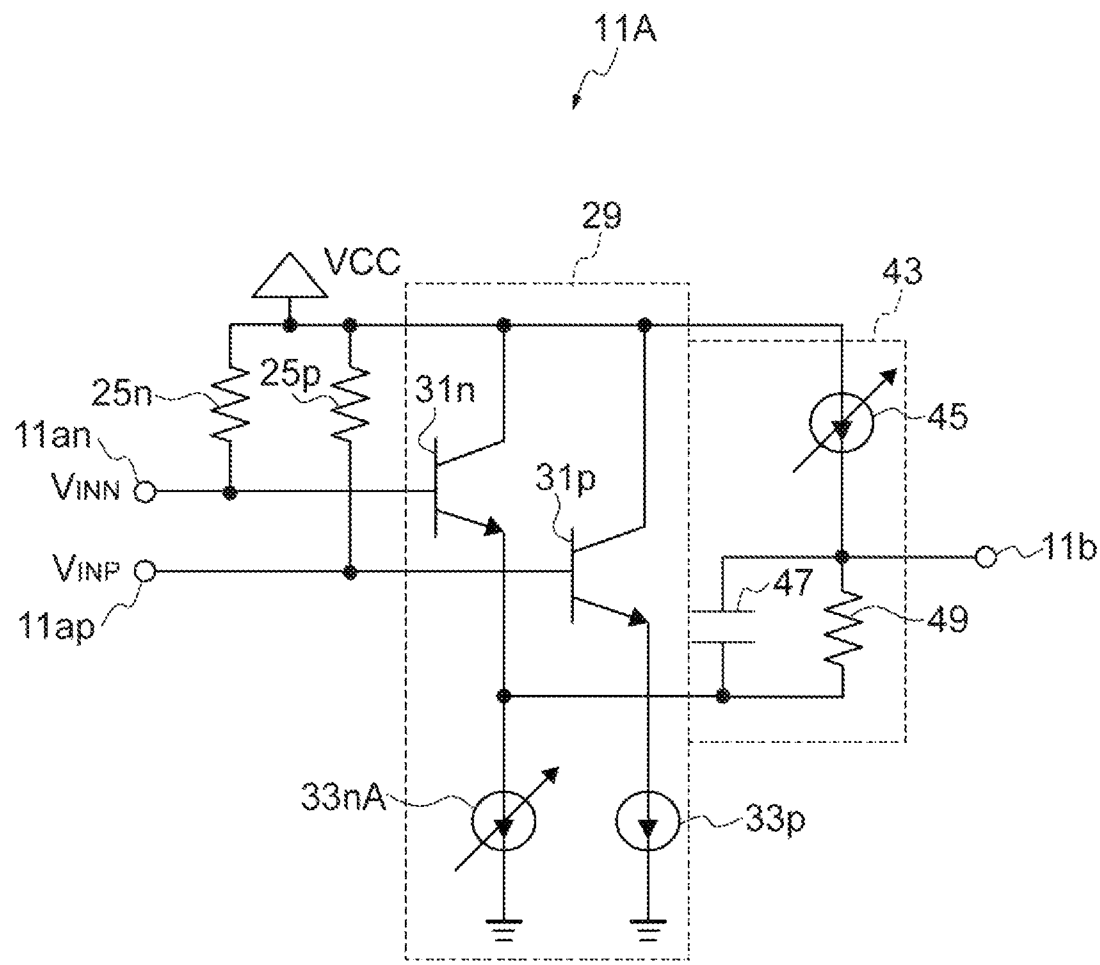
FIG. 12 is a circuit diagram illustrating a configuration of a voltage adjustment circuit 11A according to the modification example.

FIG. 12 illustrates a configuration of a voltage adjustment circuit 11A according to a modification example. The voltage adjustment circuit 11A differs from the voltage adjustment circuit 11 of the embodiment described above in not including the capacitor 21, the resistance element 23, and the current source circuit 27 but having a configuration in which the power supply voltage VCC is applied to one end of each of the resistance elements 25*n* and 25*p* via the power supply line. In addition, in the emitter follower circuit 29, a current source 33*n*A connected to the emitter of the transistor 31*n* generates a current such that the current can be increased or decreased within a change range $I_{LS}$ in accordance with the comparative voltage $Com_{out}$ output by the comparator 13. Moreover, the emitter follower circuit 29 has a configuration in which the emitter of the transistor 31*n* is electrically connected to the output terminal 11*b* via a level shift circuit 43.

The level shift circuit 43 included in the voltage adjustment circuit 11A is a circuit in which the level of the average voltage of signals is shifted between the input terminal 11*an* and the output terminal 11*b* by a predetermined shift amount. The level shift circuit 43 is configured to increase or decrease the shift amount of a direct voltage of which the level is shifted in accordance with the comparative voltage $Com_{out}$ output by the comparator 13. Specifically, the level shift circuit 43 has a current source 45, a capacitor 47, and a resistance element 49. One end of each of the capacitor 47 and the resistance element 49 is electrically connected to the input terminal 11*an* via the emitter follower circuit 29. The other end of each of the capacitor 47 and the resistance element 49 is electrically connected to the output terminal 11*b*. The power supply voltage VCC is supplied to one end of the current source 45 via the power supply line. An output of the current source 45 is electrically connected to the other end of each of the capacitor 47 and the resistance element 49, and the output terminal 11*b*. One end of each of the capacitor 47 and the resistance element 49 is also connected to the ground voltage via the current source 33*n*A. In association with an operation of the current source 33*n*A, the current source 45 generates an adjustment current which can be increased or decreased within the change range $I_{LS}$ in accordance with the comparative voltage $Com_{out}$, and the current source 45 outputs the adjustment current to the resistance element 49.

In such a modification example, for example, when the bias current Ibias is turned off and the comparative voltage $Com_{out}$ is set to a high voltage, an adjustment current generated by the current sources 45 and 33*n*A is decreased by the change range $I_{LS}$. Accordingly, when the resistance value of the resistance element 49 is set to $R_{LS}$, the level of the average voltage of the adjusted voltage signal $Vb_{SH}$ output by the voltage adjustment circuit 11A can be shifted by a shift amount reduced as much as $I_{LS}$×$R_{LS}$ from a shift amount when the change range $I_{LS}$ is zero. In this manner, the shift amount of the average voltage of the adjusted voltage signal $Vb_{SH}$ can be set based on a voltage drop caused by an adjustment current flowing in the resistance element 49. For example, if the resistance value $R_{LS}$ of the resistance element 49 is set to 200Ω when the average potential of the emitter of the transistor 31*n* is 0.2 V, and if the current value of the adjustment current flowing in the resistance element 49 is set to 4 mA when the comparative voltage $Com_{out}$ is a low voltage, the average voltage (direct voltage) of the adjusted voltage signals $Vb_{SH}$ becomes 1.0 V. In contrast, if the change range $I_{LS}$ is set to 3.5 mA, the current value of the adjustment current flowing in the resistance element 49 when the comparative voltage $Com_{out}$ is a high voltage becomes 0.5 mA, and the average voltage (direct voltage) of the adjusted voltage signal $Vb_{SH}$ becomes 0.3 V. Accordingly, the average voltage (direct voltage) of the adjusted voltage signal $Vb_{SH}$ input to the base of the transistor 9 can be suitably increased or decreased in accordance with the comparative voltage $Com_{out}$ output by the comparator 13. The present modification example has an advantage of reducing the power supply voltage VCC for obtaining the same average voltage (direct voltage) of the adjusted voltage signal $Vb_{SH}$.

Figure 13:
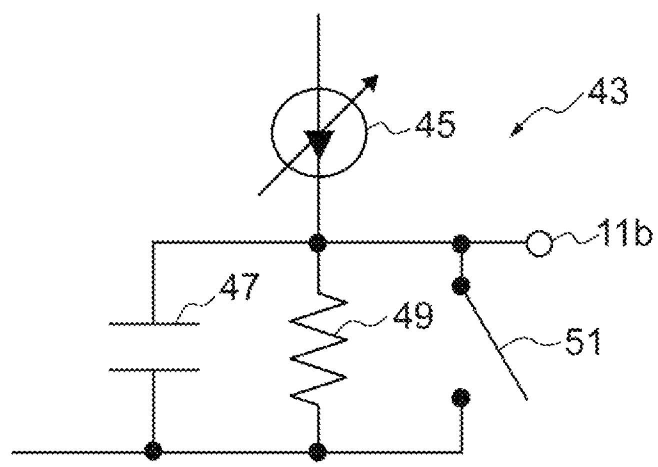
FIG. 13 is a circuit diagram illustrating another configuration of a level shift circuit 43 in FIG. 12.

The level shift circuit 43 included in the voltage adjustment circuit 11A may be changed to a configuration as illustrated in FIG. 13. That is, the level shift circuit 43 may include an electrical switch 51 constituted of an MOS transistor or the like connected to both ends of the capacitor 47 and the resistance element 49. The electrical switch 51 has a function of short-circuiting one end and the other end of each of the capacitor 47 and the resistance element 49 when the comparative voltage $Com_{out}$ is a high voltage. According to such a configuration, since the level of the average voltage $Vb_{SHave}$ of the adjusted voltage signal $Vb_{SH}$ is not shifted when the bias current Ibias is turned off, the average voltage $Vb_{Shave}$ thereof can be reduced. The switching speed of the electrical switch 51 may be in a nanosecond order or lower.

What is claimed is:

1. A laser driver circuit configured to output a shunt current for driving a laser diode in accordance with an input signal, the laser driver circuit comprising:

an adjustment circuit to which power supply voltage is applied and having an input terminal and an output terminal, the input terminal receiving the input signal, the adjustment circuit being configured to generate a shifted input signal that is shifted in voltage from the input signal by a predetermined shift amount and to output the shifted input signal from the output terminal; and a transistor having a control terminal, a first current terminal, and a second current terminal, the control terminal receiving the shifted input signal, the first current terminal being electrically connected to an anode of the laser diode, the second current terminal being electrically connected to a cathode of the laser diode and ground, the transistor being configured to vary an amount of the shunt current flowing from the first current terminal to the second current terminal in accordance with the shifted input signal, wherein the adjustment circuit includes a comparator configured to compare a voltage in the first current terminal of the transistor and a threshold voltage, and is configured to increase or decrease the predetermined shift amount in accordance with an output of the comparator.

2. The laser driver circuit according to claim 1, wherein the adjustment circuit adjusts the predetermined shift amount, such that a direct voltage of the shifted input signal is increased when the output of the comparator indicates that the voltage in the first current terminal is higher than the threshold voltage, and the direct voltage of the shifted input signal is decreased when the output of the comparator indicates that the voltage in the first current terminal is lower than the threshold voltage.

3. The laser driver circuit according to claim 1, wherein the adjustment circuit has a current source circuit configured to supply a current having a variable current value and a resistance element including a first end and a second end, the first end being an end to which the power supply voltage is applied, the second end being an end to which a ground voltage is applied via the current source circuit, and wherein the current source circuit adjusts the predetermined shift amount by increasing or decreasing the variable current value in accordance with the output of the comparator.

4. The laser driver circuit according to claim 3, wherein the current source circuit has a first current source, a second current source, and a switch configured to switch between a first connection and a second connection in accordance with the output of the comparator, the first current source being electrically connected to the resistance element through the first connection, the second current source being electrically connected to the resistance element through the second connection.

5. The laser driver circuit according to claim 1, wherein the adjustment circuit has a level shift circuit configured to shift a voltage signal in voltage as much as the predetermined shift amount that corresponds to a difference between direct voltages in the input terminal and the output terminal, and wherein the level shift circuit increases or decreases the predetermined shift amount in accordance with the output of the comparator.

6. The laser driver circuit according to claim 5, wherein the level shift circuit includes a resistance element being electrically connected to a portion between the input terminal and the output terminal, and a current source configured to output an adjustment current increased or decreased in accordance with the output of the comparator to the resistance element, and wherein the level shift circuit sets the predetermined shift amount in accordance with a voltage drop caused by the adjustment current flowing in the resistance element.

7. The laser driver circuit according to claim 5, wherein the level shift circuit includes a resistance element having a first end electrically connected to the input terminal and a second end electrically connected to the output terminal, a current source configured to output a direct current to the resistance element, and a switch configured to short-circuit the first end and the second end of the resistance element in accordance with the output of the comparator.

8. An optical transmitter comprising:

the laser driver circuit according to claim 1;

the laser diode; and a current source being connected to a portion between a power supply line to which a power supply voltage is applied and the anode of the laser diode, and configured to supply a direct current from the power supply line toward the anode of the laser diode.

* * * * *